United States Patent

Choi et al.

(10) Patent No.: US 8,492,747 B2
(45) Date of Patent: Jul. 23, 2013

(54) TRANSISTOR AND FLAT PANEL DISPLAY INCLUDING THIN FILM TRANSISTOR

(75) Inventors: Jae-young Choi, Suwon-si (KR); Hyeon-jin Shin, Suwon-si (KR); Seon-mi Yoon, Yongin-si (KR); Won-mook Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 362 days.

(21) Appl. No.: 12/911,316

(22) Filed: Oct. 25, 2010

(65) Prior Publication Data

US 2011/0095268 A1    Apr. 28, 2011

(30) Foreign Application Priority Data

Oct. 26, 2009 (KR) .......... 10-2009-0101727
Dec. 2, 2009 (KR) .......... 10-2009-0118449

(51) Int. Cl.
*H01L 29/66* (2006.01)

(52) U.S. Cl.
USPC ...... 257/29; 257/213; 257/262; 257/E29.151; 438/149; 438/151; 977/734

(58) Field of Classification Search
USPC ............ 257/29, 213, 262, E29.151; 438/149, 438/151; 977/734
See application file for complete search history.

(56) References Cited

U.S. PATENT DOCUMENTS

| 6,540,972 | B1 | 4/2003 | Hiura |
| 7,732,859 | B2 | 6/2010 | Anderson et al. |
| 2003/0044608 | A1 | 3/2003 | Yoshizawa et al. |
| 2007/0187694 | A1 | 8/2007 | Pfeiffer |
| 2009/0110627 | A1* | 4/2009 | Choi et al. .......... 423/447.1 |

FOREIGN PATENT DOCUMENTS

| JP | 2007-335532 A | 12/2007 |
| JP | 2008-205272 A | 9/2008 |
| JP | 2008-235520 A | 10/2008 |
| KR | 1020020015795 A | 3/2002 |
| KR | 1020090010758 A | 1/2009 |
| KR | 1020090043418 A | 5/2009 |
| WO | 2008/108383 A1 | 9/2008 |

* cited by examiner

*Primary Examiner* — Daniel Whalen
*Assistant Examiner* — Suberr Chi
(74) *Attorney, Agent, or Firm* — Cantor Colburn LLP

(57) ABSTRACT

A transistor includes at least three terminals comprising a gate electrode, a source electrode and a drain electrode, an insulating layer disposed on a substrate, and a semiconductor layer disposed on the substrate, wherein a current which flows between the source electrode and the drain electrode is controlled by application of a voltage to the gate electrode, where the semiconductor layer includes a graphene layer and at least one of a metal atomic layer and a metal ion layer, and where the metal atomic layer or the metal ion layer is interposed between the graphene layer and the insulating layer.

17 Claims, 2 Drawing Sheets

TRANSISTOR AND FLAT PANEL DISPLAY INCLUDING THIN FILM TRANSISTOR

CROSS-REFERENCE TO RELATED APPLICATIONS

This application claims priority to Korean Patent Application No. 10-2009-0101727, filed on Oct. 26, 2009, and Korean Patent Application No. 10-2009-118449, filed on Dec. 2, 2009, all the benefits accruing therefrom under 35 U.S.C. §119, the contents of which in their entireties are herein incorporated by reference.

BACKGROUND

1. Field

The general inventive concept relates to transistors with improved electric characteristics due to the use of graphene in a semiconductor layer thereof, and flat panel displays including the transistors.

2. Description of the Related Art

Thin film transistors ("TFT") are typically used in flat panel displays, such as liquid crystalline display devices, organic electroluminescent display devices, or inorganic electroluminescent display devices, for example, as a switching device that controls operation of pixels or as a driving device that drives pixels.

A conventional TFT typically includes a semiconductor layer that includes source and drain regions doped with a high-concentration of impurities and a channel region disposed between the source and drain regions, a gate electrode that is insulated from the semiconductor layer and is disposed corresponding to the channel region, and source and drain electrodes in contact with the source and drain regions, respectively.

In general, the source and drain electrodes are formed of a metal having a low work function so that charges flow smoothly therefrom and thereto. However, when the source and drain electrodes are formed of a metal having a low work function a contact region between the source and drain electrodes and the semiconductor layer has a high contact resistance, and thus, characteristics of a device using such a configuration are substantially deteriorated and power consumption is substantially increased.

SUMMARY

Provided are transistors with improved electric characteristics and including at least one of a metal atomic layer and a metal ion layer between a graphene layer and an insulating layer.

Provided are flat panel displays including the transistors.

Embodiments will be set forth in part in the description which follows and, in part, will be apparent from the description, or may be learned by practice of the embodiments described herein.

In an embodiment, a transistor includes at least three terminals including a gate electrode, a source electrode and a drain electrode, an insulating layer disposed on a substrate, and a semiconductor layer disposed on the substrate, where a current flowing between the source and drain electrodes are controlled by application of a voltage to the gate electrode, where the semiconductor layer includes a graphene layer and at least one of a metal atomic layer and a metal ion layer, and where the at least one of the metal atomic layer and the metal ion layer is disposed between the graphene layer and the insulating layer.

In another embodiment, a flat panel display includes a transistor and a light emitting device electrically connected to the transistor. The transistor includes at least three terminals including a gate electrode, a source electrode and a drain electrode, an insulating layer disposed on a substrate, and a semiconductor layer disposed on the substrate, where a current flowing between the source and drain electrodes are controlled by application of a voltage to the gate electrode, where the semiconductor layer includes a graphene layer and at least one of a metal atomic layer and a metal ion layer, and where the at least one of the metal atomic layer and the metal ion layer is disposed between the graphene layer and the insulating layer.

In an embodiment, a method of forming a transistor includes providing at least three terminals on a substrate, where the at least three terminals comprises a gate electrode, a source electrode and a drain electrode, providing an insulating layer on the substrate, and providing a semiconductor layer on the substrate, where the semiconductor layer comprises a graphene layer and at least one of a metal atomic layer and a metal ion layer, and the at least one of the metal atomic layer and the metal ion layer is disposed between the graphene layer and the insulating layer.

BRIEF DESCRIPTION OF THE DRAWINGS

The above and/or other aspects and features will become more apparent and more readily appreciated from the following description of the embodiments thereof with reference to the accompanying drawings, in which.

DETAILED DESCRIPTION

Figure 1:
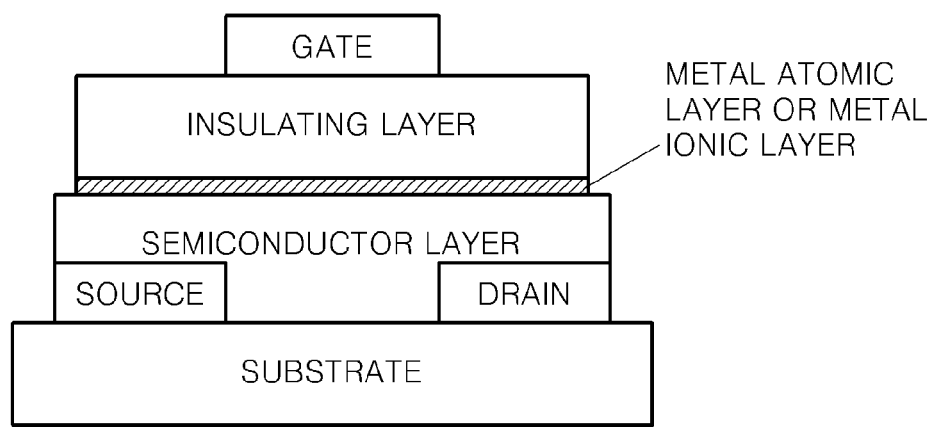
FIGS. 1 and 2 are cross-sectional views of embodiments of thin film transistors according to the present invention.

Embodiments now will be described more fully hereinafter with reference to the accompanying drawings, in which embodiments are shown. These embodiments may, however, be embodied in many different forms and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the disclosure.

All methods described herein can be performed in a suitable order unless otherwise indicated herein or otherwise clearly contradicted by context. The use of any and all examples, or exemplary language (e.g., "such as"), is intended merely to better illustrate the disclosure and does not pose a limitation on the scope thereof unless otherwise claimed. No language in the specification should be construed as indicating any non-claimed element as essential to the practice of the embodiments as used herein.

The term "graphene" used in the present disclosure means a polycyclic aromatic molecule formed from a plurality of carbon atoms covalently bound to each other. The covalently bound carbon atoms may form a six-membered ring as a repeating unit, or may further include at least one of a five-membered ring and a seven-membered ring. Accordingly, the graphene may include at least one single layer of covalently bonded carbon atoms (e.g., a $sp^2$ bond). The graphene may be a single layer, but also may include exemplary embodiments wherein the grapheme has a multi-layered structure, in which at least two single layers of graphene are stacked. A thickness of the graphene may be equal to or less than about 100 nm.

The graphene has an abnormal half-integer quantum hall-effect with respect to electrons and holes, and electron mobility of the graphene is as high as about 20,000 $cm^2$/Vs to about 50,000 $cm^2$/Vs. An electrical characteristic of the graphene layer having a given thickness changes according to crystallization orientation of the graphene layer. Accordingly, the electrical characteristic of the graphene layer may be realized in a direction selected by a user, and a device may be constructed using the realized electrical characteristic.

Hereinafter, embodiments of thin film transistors ("TFT") will be described in detail with reference to the accompanying drawings.

An embodiment of TFT includes at least three terminals that include a gate electrode, a source electrode and a drain electrode, an insulating layer disposed on a substrate and a semiconductor layer disposed on the substrate. In an embodiment, a current flowing between the source and drain electrodes is controlled by applying a voltage to the gate electrode.

The TFT includes a semiconductor layer, a source electrode, a drain electrode disposed facing the source electrode with a distance, and a gate electrode spaced apart from the source electrode and the drain electrode. The semi conductor layer includes a graphene layer and at least one of a metal atomic layer and a metal ion layer. In an embodiment, a current that flows between the source electrode and the drain electrode is controlled by applying a voltage to the gate electrode. In an embodiment, the distance between the source electrode and the drain electrode may vary based upon a predetermined characteristics of the TFT, and may be in the range of about 0.1 μm through about 1 mm. In another embodiment, the distance between the source electrode and the drain electrode may be in the range of about 1 μm to about 100 μm, or about 5 μm to about 100 μm.

Figure 2:
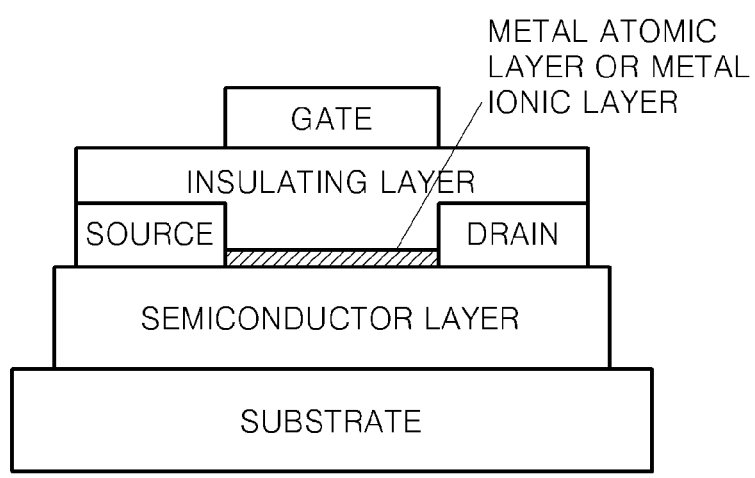

FIGS. 1 and 2 are cross-sectional views of embodiments of TFT according to the present invention. Hereinafter, an embodiment of the TFT illustrated in FIG. 1 will be described in greater detail. The embodiment of the TFT in FIG. 2 is substantially the same as the embodiment of the TFT shown in FIG. 1 except for the positions of the source electrode and the drain electrode, and any repetitive detailed description thereof will hereinafter be omitted.

Referring to FIG. 1, a semiconductor layer, a source electrode and a drain electrode spaced apart from the source electrode are disposed on a substrate, and an insulating layer and a gate are sequentially disposed on the semiconductor layer, the source electrode and the drain electrode. A channel region is disposed in the semiconductor layer. In an embodiment, a current which flows between the source electrode and the drain electrode is controlled by applying a voltage to the gate electrode, thereby turning on/off the TFT.

<Semiconductor layer>

Figure 3:
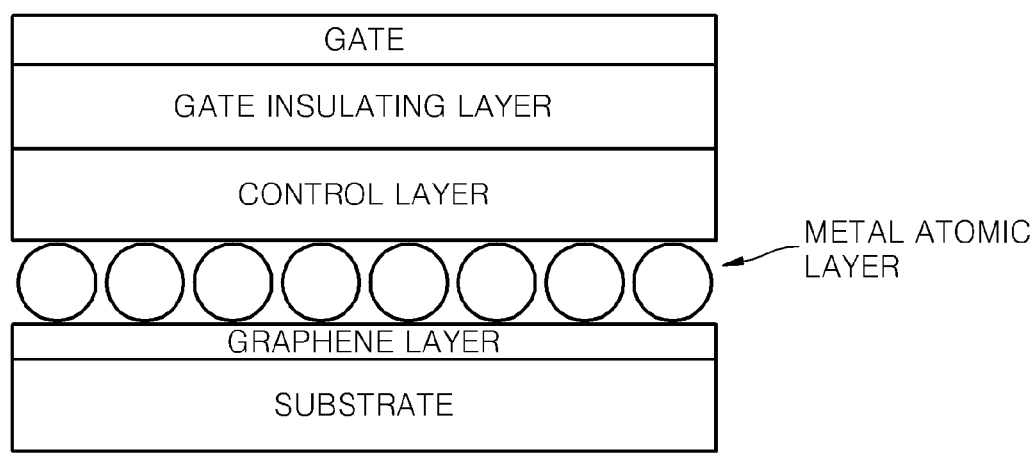
FIG. 3 is a schematic cross-sectional view of another embodiment of a thin film transistor including a graphene layer, a metal atomic layer, and a control layer interposed between the graphene layer and the metal atomic layer, according to the present invention.

The semiconductor layer includes a graphene layer (shown in FIG. 3).

A thickness of the graphene layer of the semiconductor layer may be in the range of about 0.3 nm to about 100 nm, but not being limited thereto.

<Insulating layer>

The insulating layer of the TFT may include an electrically conductive material, and the insulating layer may be in a thin film form. In an embodiment, the conductive material of the insulating layer may include a metallic oxide such as oxide of silicon, a metal nitride such as nitride of silicon, a polymer, and an organic low molecular weight molecule, for example, but not being limited thereto. The conductive material of the insulating layer may have an electric resistance equal to or greater than about 10 Ωcm. In an embodiment, the insulating layer may include an inorganic oxide having a relative dielectric constant.

Examples of the metallic oxide include silicon oxide, aluminum oxide, tantalum oxide, titanium oxide, tin oxide, vanadium oxide, titanium acid barium strontium, zirconium acid titanium acid barium, zirconium acid titanium acid lead, titanium acid lead lanthanum, titanium acid strontium, titanium acid barium, barium magnesium fluoride, lanthanum oxide, fluorine oxide, magnesium oxide, bismuth oxide, titanium acid bismuth, niobyum oxide, titanium acid strontium bismuth, tantalum acid strontium bismuth, tantalum pentoxide, tantalum acid niobium acid bismuth, trioxide yttrium and a combination/combinations thereof. In an embodiment, the inorganic oxide may include silicon oxide, aluminum oxide, tantalum oxide, or titanium oxide, for example, but not being limited thereto.

In an embodiment, the insulating layer may include an inorganic nitride such as a silicon nitride (e.g., $Si_3N_4$, $Si_xN_y$, (x, y>0)) and an aluminum nitride, for example, but not being limited thereto.

In an embodiment, the insulating layer may include a precursor material containing a metal alkoxide. In an embodiment, the insulating layer may be formed by coating a solution including the precursor material on a substrate and then subjected to a chemical solution treatment including a heat treatment process.

A metal contained in the metal alkoxide of the precursor material may be at least one selected from the group consisting of transition metals, lanthanoides and main group elements. In an embodiment, the metal contained in the metal alkoxide may be barium(Ba), strontium(Sr), titanium(Ti), bismuth(Bi), tantalum(Ta), zirconium(Zr), iron (Fe), nickel (Ni), manganese (Mn), lead(Pb), lanthanum(La), lithium (Li), sodium (Na), potassium (K), rubidium (Rb), cesium (Cs), francium (Fr), beryllium (Be), magnesium(Mg), calcium (Ca), niobium (Nb), thallium (Tl), mercury (Hg), copper(Cu), cobalt (Co), rhodium (Rh), scandium (Sc), or yttrium (Y), for example, but not being limited thereto. An alkoxide contained in the metal alkoxide may be derived from alcohols or alkoxy alcohols. Examples of the alcohols include methanol, ethanol, propanol, isopropanol, butanol, and isobutanol. Examples of the alkoxy alcohols include methoxy ethanol, ethoxy ethanol, propoxy ethanol, butoxy ethanol, pentoxy ethanol, heptoxy ethanol, methoxy propanol, ethoxy propanol, propoxy propanol, butoxy propanol, pentoxy propanol and heptoxy propanol.

When the insulating layer includes materials described above, polarization may effectively occur in the insulating layer, and a threshold voltage for driving a transistor may be substantially lowered. In addition, when the insulating layer includes a silicon nitride such as $Si_3N_4$, $Si_xN_y$, or $SiON_x$(x, y>0), a depletion layer may be efficiently formed and the threshold voltage for driving a transistor may be substantially lowered.

In an embodiment, the insulating layer may also include a polyimide, poly amide, polyester, polyacrylate, an optical radical polymerization system, a photocurable resin of an optical cation polymerization system, an acrylonitrile-containing copolymer, a polybiphenole, polybivinylalcohol, a novolac resin, or cyanoethylpullulan, for example, but not being limited thereto.

In an embodiment, the insulating layer may also include wax, polyethylene, polychloropyrene, polyethyleneterephthalate, polyoxymethylene, polybinylchloride, polyvinylidene fluoride, polymethylmethacrylate, polysulfone, polycarbonate, polyimidcyanoethyl pullulan, poly(binylphenol)("PVP"), poly(methylmethacrylate)("PMMA"), polycarbonate ("PC"), polystyrene ("PS"), polyolefin, polyacrylamide, poly(acrylic acid), novolak resin, resol resin, polyimid, polyxylene, epoxy resin, or a polymer having a high dielectric constant such as pullulan, for example, but not being limited thereto.

Organic compounds and polymers, which may be included in the insulating layer, have water repellency, and interaction between the insulating layer and the organic semiconductor layer is thereby substantially suppressed and crystallinity of the semiconductor layer is thereby substantially enhanced by cohering characteristics of the organic semiconductor layer itself. Accordingly, performance of a device including the insulating layer, e.g., embodiments of the TFT, is substantially improved.

In an embodiment, the insulating layer may include a layer in which at least two materials among the inorganic or organic compounds described above are mixed. In another embodiment, the insulating layer may include at least two layers, each of which include at least one of the at least two materials among the inorganic or organic compounds described above. Accordingly, performance of a device including the insulating layer, e.g., embodiments of the TFT, may be controlled by mixing a material having a high dielectric constant and a material having water repellency or by stacking a layer including a material having a high dielectric constant and a layer including a material having water repellency.

In an embodiment, the insulating layer may include an anodic oxide layer. The anodic oxide layer may be sealed. The anodic oxide layer may be formed by anodizing a metal using a known method. The metal that is capable of anodized may be aluminum or tantalum, for example, and the anodizing method may be any known method, not being limited to a certain method. The anodizing method may be performed using an electrolyte that may be used to form a porous oxidized layer. Examples of the electrolyte include a sulfuric acid, a phosphoric acid, an oxalic acid, a cromminc acid, a boric acid, a sulphaminic acid, a benzensulfonic acid, a mixed acid of at least two of the acids describe above, and a salt thereof. The anodizing may be performed under various conditions based on an electrolyte used. In an embodiment, the concentration of the electrolyte may be in the range of about 1 mass % to about 80 mass %, the temperature of the electrolyte may be in the range of about 5° C. to about 70° C., a current density may be in the range of about 0.5 $A/cm^2$ to about 60 $A/cm^2$, a voltage may be in the range of about 1 voltages to about 100 voltages, and an electrolysis time may be in the range of about 10 seconds to about 5 minutes. In an embodiment, the anodizing may be performed using an aqueous solution of a sulfuric acid, a phosphoric acid, or a boric acid as an electrolyte at a direct current or an alternating current, and at a temperature of the electrolyte in the range of about 20° C. to about 50° C., and at a current density in the range of about 0.5 $A/cm^2$ to about 20 $A/cm^2$, for about 20 seconds to about 250 seconds, in which the concentration of the acids described above may be in the range of about 5 mass % to about 45 mass %.

The insulating layer may be formed by using a dry process, a coating process, or a wetting process, for example, but not being limited thereto. Examples of the dry process include a vacuum deposition method, a molecular beam epitaxial growth method, an ion cluster beam method, a low energy ion beam method, an ion plating method, a chemical vapor deposition ("CVD") method, a sputtering method, or an atmospheric plasma method. Examples of the coating method include a spray coating method, a spin coating method, a blade coating method, a dip coating method, a casting coating method, a roll coating method, a bar coating method, and a dye coating method. Examples of the wetting process include a printing method and an ink-jetting method. The methods described above may be selected based on a material for forming the insulating layer. The wetting process may be performed using a sol-gel method. In an embodiment, particulates of inorganic oxide may be dispersed in an organic solvent or water by using a dispersion stabilizer such as a surfactant, for example, to prepare a dispersion and then drying is performed thereon. In another embodiment, the dispersion stabilizer may be omitted, and an oxide precursor, e.g., a solution of alkoxide, may be coated and then dried.

The semiconductor layer may further include at least one of a metal atomic layer and a metal ion layer. The at least one of the metal atomic layer and the metal ion layer is interposed between the graphene layer and the insulating layer. The metal atomic layer may include zinc (Zn), aluminum (Al), gallium (Ga), zirconium (Zr), nickel (Ni), cobalt (Co), palladium (Pd), or a mixture thereof, for example, but not being limited thereto. The metal ion layer may include an ion of Zn, Al, Ga, Zr, Ni, Co, Pd, or a mixture thereof, for example, but not being limited thereto. The ions may be in the form of a metal salt. Anions corresponding to the metal salts may include halogen, $(COON)^{-1}$, $NO_3^{2-}$, $SO_4^{2-}$, or $CO_3^{-2}$, for example, but not being limited thereto. The at least one of the metal atomic layer and the metal ion layer may have a thickness corresponding to a single atomic layer, a double atomic layers, or a triple atomic layers.

The at least one of the metal atomic layer and the metal ion layer may be formed by using a dry process, a coating process, or a wetting process, for example, but not being limited thereto. Examples of the dry process include a vacuum deposition method, a molecular beam epitaxial growth method, an ion cluster beam method, a low energy ion beam method, an ion plating method, a chemical vapor deposition ("CVD") method, a sputtering method and an atmospheric plasma method. Examples of the coating process include a spray coating method, a spin coating method, a blade coating method, a dip coating method, a casting coating method, a roll coating method, a bar coating method and a dye coating method. Examples of the wetting process include a printing method and an ink-jetting method. At least one method among the methods described above may be selected based on a material included in the at least one of the metal atomic layer and the metal ion layer.

The graphene layer may be formed by cutting a graphene sheet to a given size, or by directly growing graphene on a substrate. A method of forming a graphene sheet is disclosed in Korean Patent Application No. 10-2008-0023457[jhk1] which is incorporated herein by reference in its entirety.

<Control layer>

FIG. 3 is a schematic cross-sectional view of another embodiment of a thin film transistor including a graphene layer, a metal atomic layer, and a control layer interposed between the graphene layer and the metal atomic layer, according to the present invention. As described above, at least one of the metal atomic layer and the metal ion layer is disposed between the graphene layer of the semiconductor layer and the insulating layer. Referring now to FIG. 3, an embodiment of the TFT may further include a control layer disposed between the insulating layer and the at least one of the metal atomic layer and the metal ion layer.

The control layer may include at least one selected from the group consisting of oxides, nitrides and sulfides. Examples of the sulfides include zinc sulfide (ZnS), cadmium sulfide (CdS), calcium sulfide (CaS), yttrium sulfide ($Y_2S_3$), gallium sulfide ($Ga_2S_3$), strontium sulfide (SrS) and barium sulfide (BaS), and examples of the oxides include zinc oxide (ZnO), yttrium oxide ($Y_2O_3$), and aluminum oxide ($Al_2O_3$). In addition, examples of the nitrides include aluminum nitride (AlN), gallium nitride (GaN) and indium nitride (InN).

When the control layer is disposed on the graphene layer, the metal atomic layer is formed on the graphene layer by ultra high vacuum and then oxidized. In an embodiment, aluminum (Al) may be deposited on the graphene layer by ultra high vacuum to form a one, two, or three-layered structure, and then the Al layer is oxidized under oxidizing conditions, thereby forming the control layer including an oxide.

<Substrate>

A substrate used in a transistor, e.g., the TFT, may support the structure of the TFT. In an embodiment, the substrate may be formed of glass, an inorganic compound such as a metallic oxide or nitride, a plastic material such as polyethylene terephthalate ("PET"), poly(ether sulfones) ("PES"), or polycarbonate ("PC"), a metal, or a composite thereof, for example, but not being limited thereto. The substrate may have a stacked layer structure including layers, each formed of at least one of these materials. In another embodiment, the substrate may be other constituents that support the TFT[jhk2]. In an embodiment, the substrate may be a silicon (Si) wafer, and the Si wafer may be used as the gate electrode and the substrate. In another embodiment, the substrate may be a silicon (Si) wafer, and a surface of the Si wafer may be oxidized to form a $SiO_2$ layer as the insulating layer. When the Si substrate is used as the gate electrode and the substrate, a metal layer formed of, for example, gold (Au), may be disposed on the Si substrate as an electrode that connects a lead wire.

<Electrode>

In an embodiment, the at least three terminals, e.g., the gate electrode, the source electrode and the drain electrode, of the TFT may include a conductive material. Each of the gate electrode, the source electrode, and the drain electrode may include platinum, gold, silver, nickel, chromium, copper, iron, tin, hard lead, tantalum, indium, palladium, tellurium, rhenium, iridium, aluminum, ruthenium, germanium, molybdenum, tungsten, tin oxide antimony, indium oxide tin ("ITO"), fluoride-doped zinc oxide, zinc, carbon, graphite, glass-phase carbon, silver paste, carbon paste, lithium, beryllium, sodium, magnesium, potassium, calcium, scandium, titanium, manganese, zirconium, gallium, niobium, sodium, an alloy containing sodium and potassium, magnesium, lithium, aluminum, a mixture containing magnesium and copper, a mixture containing magnesium and silver, a mixture containing magnesium and aluminum, a mixture containing magnesium and indium, a mixture containing aluminum and aluminum oxide, or a mixture containing lithium and aluminum, for example, but not being limited thereto. In an embodiment, the conductive material of the electrode may be deposited by sputtering or vacuum deposition, for example, but not being limited thereto.

In an embodiment, the source electrode and the drain electrode may include a fluid electrode material such as a solution, paste, ink or dispersion of such fluid conductive material, for example, but not being limited thereto. In addition, a solvent or dispersing medium for the fluid electrode material may include at least about 60 mass %, or at least about 90 mass %, of water not to affect the organic semiconductor layer. A metallic particulate-containing dispersion may be any known conductive paste, and may be a dispersion that has metallic particulates having a particle diameter in the range of about 0.5 nm to about 50 nm, or in the range of about 1 nm to about 10 nm. Such metallic particulates may include platinum, gold, silver, nickel, chromium, copper, iron, tin, hard lead, tantalum, indium, palladium, tellurium, rhenium, iridium, aluminum, ruthenium, germanium, molybdenum, tungsten, or zinc, for example, but not being limited thereto.

Such metallic particulates may be dispersed in a dispersion medium such as water or any organic solvent by using a dispersion stabilizer such as an organic material, and the obtained dispersions are used to form the electrode. The dispersions of such metallic particulates may be prepared using, for example, a physical method, such as sputtering or metal vapor synthesis, or a chemical method in which metallic ions are reduced into a liquid phase to generate metallic particulates. Examples of the chemical method include a colloid method or a co-precipitation method.

The electrode is molded using such metallic particulate dispersions, and a solvent used is dried, and the molded structure is heated at a temperature, for example, in the range of about 100° C. to about 300° C., or in the range of about 150° C. to about 200° C., while maintaining the shape of the molded structure, thereby thermally fusing metallic particulates to form an electrode pattern having a target shape. In another embodiment, the heating process may be omitted.

In an embodiment, the gate electrode, the source electrode and the drain electrode may include a known conductive polymer that obtains a high conductivity by doping, such as conductive polyanilin, conductive polypyrrole, conductive polythiophene (a comoplex of polyethylenedioxythiophene and polystyrenesulfonic acid), or a complex of polyethylenedioxythiophene ("PEDOT") and polystyrenesulfonic acid, for example, but not being limited thereto. When the known conductive polymer is used, a contact resistance between the source and drain electrodes and the semiconductor layer is substantially reduced.

In an embodiment, the source electrode and the drain electrode may include a material that enables a contact surface between the source and the semiconductor layer and between the drain electrodes and the semiconductor layer to have a small electric resistance. The electric resistance corresponds to electric field mobility when a current-control device is manufactured, and high electric field mobility is obtained when the electric resistance is low.

When the work function of the electrode material W is denoted by a, an ionization potential ("Ip") of the semiconductor layer is denoted by b, and an electron affinity ("Af") of the semiconductor layer is denoted by c, a, b and c may satisfy the following relationships. In this regard, all of a, b and c are positive values with respect to a vacuum potential.

In a p-type TFT, $b-a<1.5$ eV or $b-a<1.0$ eV.

Although a device having a high performance is obtained when the relationship with respect to the semiconductor layer satisfies the inequalities above, a metal having as a high work function as possible may be selected as the electrode material. In this case, the work function may be equal to or greater than 4.0 eV or equal to or greater than 4.2 eV.

The metal having a high work function may include Ag(4.26, 4.52, 4.64, 4.74 eV), Al(4.06, 4.24, 4.41 eV), Au(5.1, 5.37, 5.47 eV), Be(4.98 eV), Bi(4.34 eV), Cd(4.08 eV), Co(5.0 eV), Cu(4.65 eV), Fe(4.5, 4.67, 4.81 eV), Ga(4.3 eV), Hg(4.4 eV), Ir(5.42, 5.76 eV), Mn(4.1 eV), Mo(4.53, 4.55, 4.95 eV), Nb(4.02, 4.36, 4.87 eV), Ni(5.04, 5.22, 5.35 eV), Os(5.93 eV), Pb(4.25 eV), Pt(5.64 eV), Pd(5.55 eV), Re(4.72 eV), Ru(4.71 eV), Sb(4.55, 4.7 eV), Sn(4.42 eV), Ta(4.0, 4.15, 4.8 eV), Ti(4.33 eV), V(4.3 eV), W(4.47, 4.63, 5.25 eV), or Zr(4.05 eV), for example, but not being limited thereto. In an embodiment, the metal having a high work function may be a novel metal (e.g., Ag, Au, Cu, or Pt), Ni, Co, Os, Fe, Ga, Ir, Mn, Mo, Pd, Re, Ru, V, or W, for example. In another embodiment, the electrode may include ITO, polyanilin, a conductive polymer such as a PSS-doped PEDOT, or carbon, for example, but not being limited thereto. The electrode materials having a high work function may be used individually or in combination such that the work function of the electrode material W satisfies the inequalities above.

In an n-type TFT, $a-c<1.5$ eV or $a-c<1.0$ eV.

Although a device having a high performance is obtained when the relationship with respect to the semiconductor layer satisfies the inequalities above, a metal having as a low work function as possible may be selected as the electrode material. In this case, the work function may be equal to or less than 4.3 eV or may be equal to or less than 3.7 eV.

The electrode material having a low work function may be Ag (4.26 eV), Al(406, 4.28 eV), Ba(2.52 eV), Ca(2.9 eV), Ce(2.9 eV), Cs(1.95 eV), Er(2.97 eV), Eu(2.5 eV), Gd(3.1 eV), Hf(3.9 eV), In(4.09 eV), K(2.28 eV), La(3.5 eV), Li(2.93 eV), Mg(3.66 eV), Na(2.36 eV), Nd(3.2 eV), Rb(4.25 eV), Sc(3.5 eV), Sm(2.7 eV), Ta(4.0, 4.15 eV), Y(3.1 eV), Yb(2.6 eV), or Zn(3.63 eV). The metal having a low work function may be Ba, Ca, Cs, Er, Eu, Gd, Hf, K, La, Li, Mg, Na, Nd, Rb, Y, Yb or Zn, for example. These electrode materials having a low work function may be used individually or in combination, as long as the work function of the electrode material W satisfies the inequalities above. In an embodiment, since the electrode materials having a low work function easily deteriorate when exposed to water vapor or oxygen in the atmosphere, the electrode materials having a low work function may be coated with a material that is stable in the atmosphere, such as silver (Ag) or gold (Au). The coating thickness may be equal to or greater than about 10 nm. Although the greater coating thickness may be more effective to protect the electrode materials from oxygen or water, if practical use and productivity are taken into consideration, the coating thickness may be equal to or less than about 1 μm.

The electrode may be formed by, for example, deposition, electron-beam deposition, sputtering, an atmospheric plasma method, ion plating, chemical vapor deposition ("CVD"), electrodeposition, electroless deposition, spin coating, printing, or ink-jetting. If patterning is further needed to form the electrode, a conductive thin film formed by such methods may be patterned by known photolithography or a lift-off method. In another embodiment, a metal thin film formed of aluminum or copper may be patterned by forming a resist by thermal transfer or ink-jetting and then performing etching thereon. In another embodiment, a solution or dispersion of a conductive polymer, or a dispersion containing a metallic particulate may be directly ink-jetted to form a pattern. In another embodiment, lithography and laser polishing may be conductive polymer, a metallic particulate-containing conductive ink or a conductive paste may form a pattern by relief printing, engraving printing, flat panel printing, or screen printing.

The thickness of each of the source electrode and the drain electrode may not be limited to a certain thickness as long as a current flows therebetween. In an embodiment, the thickness of each of the source electrode and the drain electrode may be in the range of about 0.2 nm to about 10 μm. In another embodiment, the thickness of each of the source electrode and drain electrode may be in the range of about 4 nm to about 300 nm. If the thickness of each of the source electrode and the drain electrode is within the ranges described above, resistance is high due to the small thickness and thus a voltage drop may be effectively prevented. In an embodiment, the source electrode and the drain electrode may be effectively formed since the thickness of each of the source electrode and the drain electrode is relatively thin, and a stacked structure may be effectively formed without formation of a step when other layers, e.g., a protective layer or an organic semiconductor layer, are deposited thereon. In an embodiment, the TFT may include a buffer layer disposed between the semiconductor layer and the source and drain electrodes, and injection efficiency is thereby substantially improved.

In the case of the n-type TFT, the buffer layer may include a material for an anode of an organic light emitting device including an alkali metal such as LiF, $Li_2O$, CsF, $NaCO_3$, KCl, $MgF_2$, or $CaCO_3$, an alkali earth metal, or a compound having an ionization bond, for example, but not being limited thereto. In another embodiment, the buffer layer may include a compound for an electron injection layer or a compound for an electron transport layer of an organic light emitting device, such as Alq(tris(8-quinolinol)aluminum complex), for example, but not being limited thereto.

In the case of the p-type TFT, the buffer layer may include a cyano compound such as $FeCl_3$, Tetracyanoquinodimethane ("TCNQ"), tetrafluorotetracyanoquinodimethane ("F4-TCNQ"), or Histone acetyl transfereses ("HAT"); $CF_x$; a metallic oxide excluding alkali metal or alkali earth metal, such as $GeO_2$, $SiO_2$, $MoO_3$, $V_2O_5$, $VO_2$, $V_2O_3$, MnO, $Mn_3O_4$, $ZrO_2$, $WO_3$, $TiO_2$, $In_2O_3$, ZnO, NiO, $HfO_2$, $Ta_2O_5$, $ReO_3$, or $PbO_2$; or an inorganic compound such as ZnS or ZnSe, for example, but not being limited thereto. Most of the oxides cause oxygen depletion and are suitable for injecting holes. In an embodiment, the buffer layer may include a material for a hole injection layer or a hole transport layer of an organic light emitting device, such as an amine-based compound or copper phthalocyanine ("CuPc"). These materials may be also be used in combination to form a buffer layer. Examples of the amine-based compound include N,N'-bis(3-methylphenyl)-N,N'-diphenyl-(1,1'-biphenyl)-4,4'-diamine ("TPD") and 4,4'-bis[N-(1-naphthyl)-N-phenylamino]biphenyl ("NPD").

The buffer layer lowers an injection barrier of a carrier and thus lowers a threshold voltage, and a transistor is thereby effectively driven at low voltage. The buffer layer may be substantially thin and disposed between an electrode and an organic semiconductor layer. In an embodiment, the thickness of the buffer layer may be in the range of about 0.1 nm to about 30 nm, or in the range of about 0.3 nm to about 20 nm.

The TFT may be electrically connected to a light emitting device and the light emitting device is controlled by changing a current flowing between the source electrode and the drain electrode. An embodiment of a flat panel display includes the TFT and the light emitting device.

The present invention should not be construed as being limited to the embodiments set forth herein. Rather, these embodiments are provided so that this disclosure will be thorough and complete and will fully convey the concept of the present invention to those skilled in the art.

For example, exemplary embodiment also include a method of forming a TFT includes providing at least three terminals on a substrate, where the at least three terminals includes a gate electrode, a source electrode and a drain electrode, providing an insulating layer on the substrate, and providing a semiconductor layer on the substrate, where the semiconductor layer includes a graphene layer and at least one of a metal atomic layer and a metal ion layer and the at least one of the metal atomic layer, and where the metal ion layer is disposed between the graphene layer and the insulating layer.

It should be understood that the embodiments described therein should be considered in a descriptive sense only and not for purposes of limitation. Descriptions of features or aspects within each embodiment should typically be considered as available for other similar features or aspects in other embodiments.

What is claimed is:

1. A transistor comprising:
   at least three terminals comprising a gate electrode, a source electrode and a drain electrode;
   an insulating layer disposed on a substrate; and
   a semiconductor layer disposed on the substrate,
   wherein a current which flows between the source electrode and the drain electrode is controlled by application of a voltage to the gate electrode,
   wherein the semiconductor layer comprises a graphene layer and at least one of a metal atomic layer and a metal ion layer, and
   wherein the at least one of the metal atomic layer and the metal ion layer is disposed between the graphene layer and the insulating layer.

2. The transistor of claim 1, wherein
   the metal atomic layer comprises at least one selected from the group consisting of zinc (Zn), aluminum (Al), gallium (Ga), zirconium (Zr), nickel (Ni), cobalt (Co), and palladium (Pd), and
   the metal ion layer comprises at least one metal ion of at least one selected from the group consisting of zinc (Zn), aluminum (Al), gallium (Ga), zirconium (Zr), nickel (Ni), cobalt (Co), and palladium (Pd).

3. The transistor of claim 1, wherein the at least one of the metal atomic layer and the metal ion layer has a layered atomic structure, wherein the layered atomic structure has at least one and less than four layers.

4. The transistor of claim 2, wherein the at least one of the metal atomic layer and the metal ion layer has a layered atomic structure, wherein the layered atomic structure has at least one and less than four layers.

5. The transistor of claim 1, wherein a thickness of the graphene layer is in a range of about 0.3 nm to about 100 nm.

6. The transistor of claim 1, further comprising a control layer interposed between the insulating layer and the at least one of the metal atomic layer and the metal ion layer.

7. The transistor of claim 2, further comprising a control layer interposed between the insulating layer and the at least one of the metal atomic layer and the metal ion layer.

8. A flat panel display comprising:
   a transistor comprising:
     at least three terminals comprising a gate electrode, a source electrode and a drain electrode;
     an insulating layer disposed on a substrate; and
     a semiconductor layer disposed on the substrate,
     wherein a current which flows between the source electrode and the drain electrode is controlled by application of a voltage to the gate electrode, wherein the semiconductor layer comprises a graphene layer and at least one of a metal atomic layer and a metal ion layer, and wherein the at least one of the metal atomic layer and the metal ion layer is disposed between the graphene layer and the insulating layer; and a light emitting device electrically connected to the transistor.

9. The flat panel display of claim 8, wherein the metal atomic layer comprises at least one selected from the group consisting of zinc (Zn), aluminum (Al), gallium (Ga), zirconium (Zr), nickel (Ni), cobalt (Co), and palladium (Pd), and the metal ion layer comprises at least one metal ion of at least one selected from the group consisting of zinc (Zn), aluminum (Al), gallium (Ga), zirconium (Zr), nickel (Ni), cobalt (Co), and palladium (Pd).

10. The flat panel display of claim 8, wherein the at least one of the metal atomic layer and the metal ion layer has a layered atomic structure, wherein the layered atomic structure has at least one and less than four layers.

11. The flat panel display of claim 9, wherein the at least one of the metal atomic layer and the metal ion layer has a layered atomic structure, wherein the layered atomic structure has at least one and less than four layers.

12. The transistor of claim 8, wherein a thickness of the graphene layer is in a range of about 0.3 nm to about 100 nm.

13. The flat panel display of claim 8, further comprising a control layer interposed between the insulating layer and the at least one of the metal atomic layer and the metal ion layer.

14. The flat panel display of claim 9, further comprising a control layer interposed between the insulating layer and the at least one of the metal atomic layer and the metal ion layer.

15. A method of forming a transistor, the method comprising:

providing at least three terminals on a substrate, wherein the at least three terminals comprises a gate electrode, a source electrode and a drain electrode;

providing an insulating layer on the substrate; and providing a semiconductor layer on the substrate, wherein the semiconductor layer comprises a graphene layer and at least one of a metal atomic layer and a metal ion layer, wherein the at least one of the metal atomic layer and the metal ion layer is disposed between the graphene layer and the insulating layer.

16. The method of claim 15, providing a semiconductor layer comprising forming at least one of the metal atomic layer and a metal ion layer by using one of a dry process, a coating process and a wetting process.

17. The method of claim 15, further comprising providing a control layer between the insulating layer and the at least one of the metal atomic layer and the metal ion layer.

* * * * *